United States Patent [19]
Yoon et al.

[11] Patent Number: 4,994,409
[45] Date of Patent: Feb. 19, 1991

[54] METHOD FOR MANUFACTURING A TRENCH CAPACITOR USING A PHOTORESIST ETCH BACK PROCESS

[75] Inventors: Yong H. Yoon; Cheol K. Bok, both of Seoul, Rep. of Korea

[73] Assignee: Hyundai Electronics Industries Co. Ltd., Kyungki, Rep. of Korea

[21] Appl. No.: 381,288

[22] Filed: Jul. 18, 1989

[30] Foreign Application Priority Data

Jul. 22, 1988 [KR] Rep. of Korea .................... 88-9191

[51] Int. Cl.$^5$ .................................. H01L 21/70
[52] U.S. Cl. ................................. 437/164; 437/47; 437/52; 437/60; 437/228; 437/235; 437/919
[58] Field of Search ............. 437/160, 161, 162, 164, 437/47, 52, 60, 228, 235, 919; 156/643

[56] References Cited

U.S. PATENT DOCUMENTS

| | | | |
|---|---|---|---|
| 4,295,924 | 10/1981 | Garmache et al. | 156/643 |
| 4,364,074 | 12/1982 | Garmache et al. | 357/23.6 |
| 4,569,701 | 2/1986 | Oh | 437/164 |
| 4,755,486 | 7/1988 | Triechel et al. | 437/164 |
| 4,782,036 | 11/1988 | Becker et al. | 437/164 |

*Primary Examiner*—Brian E. Hearn
*Assistant Examiner*—Tom Thomas
*Attorney, Agent, or Firm*—Low & Low

[57] ABSTRACT

A method for manufacturing a trench capacitor in a silicon wafer using a photoresist etch back process comprising sequentially depositing an oxide layer, a nitride layer and an oxide layer as a mask layer on the Si wafer and coating the mask layer with a photoresist layer is disclosed. A first pattern is formed by removing a portion of the photoresist layer and a second a mask pattern is formed by removing the exposed mask layer along the photoresist pattern, and then completely removing the photoresist. A trench is formed in the Si wafer along the second mask pattern. A thin doped oxide layer having a constant thickness is deposited outside and inside the trench. The doped oxide layer is entirely coated with a photoresist, thereby filling the trench with photoresist. The top surface of the photoresist is then planarized. The resulting photoresist coated Si wafer is baked and the photoresist deposited outside and inside the trench is selectively etched back. The doped oxide layer is selectively etched to the photoresist remaining in the trench, together with the oxide layer. The photoresist remaining inside the trench is completely removed. The doped oxide remaining inside the trench is thermally processed, thereby forming a selective doping region along the wall of the trench in the Si wafer.

7 Claims, 2 Drawing Sheets

METHOD FOR MANUFACTURING A TRENCH CAPACITOR USING A PHOTORESIST ETCH BACK PROCESS

FIELD OF THE INVENTION

The present invention relates to a method for manufacturing a trench capacitor which selectively forms a doping region at the side wall of a trench capacitor of VLSI (Very Large Scale Integration) above the mega DRAM, and more particuarly, to a method for manufacturing a trench capacitor using a photoresist etch back process which can selectively dope the side wall of the trench capacitor to the extent desired by using a photoresist.

RELATED APPLICATION

Use of this method for manufacturing a trench capacitor utilizing a photoresist etch back process is fully described in a copending patent application, filed concurrently herewith, entitled: Dynamic Random Access Memory Cell and Method, by Jae Chul Om and In Sool Chung, inventors, and assigned to Hyundai Electronics Industries Co., LTD., having Ser. No. 07/381,289, said application being expressly incorporated herein by reference as if fully set forth hereat.

INFORMATION DISCLOSURE STATEMENT

In the prior art, in order to dope a side wall of a trench capacitor doped oxide, such as BSG(Boro-Silica-Glass) or PSG(Phosphorus-Silica-Glass), is deposited to a desired thickness by first filling-up a previously formed trench. The doped oxide is then etched to a desired depth, and the P+ region formed by thermal process. Any remaining doped oxide inside the trench is removed by wet etching process and other processes known in the art.

However, in the prior art process, since the doped oxide, such as said BSG or PSG, is very thick when deposited, wet etching time is increased, and thus the Si wafer surface and the trench inside of the Si wafer are damaged by the increased process time. Also, determination of the etch rate in the trench is difficult, making accurate and selective etching more difficult thereby considerably decreasing uniformity among products produced by the prior art process.

Therefore, it is an object of the present invention to solve the disadvantages of the prior art trench capacitor, and to provide a method for manufacturing a trench capacitor using a photoresist etch back process which can selectively dope the side wall of the trench capacitor as desired part only after exact etching of doped oxide of doping free part using a photoresist.

SUMMARY OF THE INVENTION

This invention relates to a method for manufacturing a trench capacitor using a photoresist etch back process which comprises providing a silicon wafer. An oxide layer, a nitride layer and an oxide layer are then sequently deposited as a mask layer on the Si wafer. The mask layer is then coated with a photoresist layer. A first mask pattern is then formed by removing a portion of the photoresist layer. A second mask pattern is formed by removing the exposed mask layer along the photoresist pattern, and removing the photoresist completely. A trench is formed in the Si wafer along the second mask pattern. A thin doped oxide layer having a constant thickness is deposited outside and inside the trench. The doped oxide layer is entirely coated with a photoresist, thereby filling the trench with photoresist. The top surface of the photoresist is planarized. The resulting photoresist coated Si wafer is baked, and the photoresist deposited outside and inside the trench is selectively etched back. The doped oxide layer is etched back to the photoresist remaining in the trench and the oxide layer underlying the doped oxide layer is also etched back. The photoresist remaining inside the trench is completely removed. The remaining doped oxide inside the trench is then thermally processed, thereby forming a selective doping region along the wall of the trench in the Si wafer.

According to the present invention, photoresist etch back process utilizes three methods: the wet station-method, the track-method and the Oxygen plasma-gas method.

First, the wet station-method is a photoresist etching process using a mixture of developer and pure De-Ionized water (hereinafter referred to as "water") with the intended extent of photoresist etching rate being determined by sample etching, and then time etching is performed according to the calculation of the desired etch thickness. It has excellent productivity and has some advantages as explained below. Etch rate can be controlled by varing the mixed amounts of developer, such as KTI 934 developer, and water. Etch rate is decreased by increasing the amount of water relative to the amount of developer and is increased by increasing the amount of developer relative to the amount of water.

Second, the track-method is a photoresist etching process in which the photoresist is etched to an intended extent by using developer on the track. The track-method has numerous advantages providing uniform results, decreased particle effect, process simplicity and reproducibility. Also, it has an advantage in controlling the etch rate by adjusting the etchant heating temperature and selecting the kind of developer, such as NMD-2 or NMD-3.

Third, the Oxygen plasma-gas method is a photoresist etching process using Oxygen plasma with a known dry etcher instead of a mixture of developer and water.

Therefore, according to the present invention, since doped oxide, such as BSG or PSG, can be used to form a thin film by using a photoresist etch back process, it is possible to exactly etch away the useless part of the doped oxide.

Furthermore, according to the present invention, the surface of the Si wafer and the inside of a trench are protected from damage because of a decrease in the etching time required. The method according to the present invention especially provides good selective etching characteristics and improved uniformity.

BRIEF DESCRIPTION OF THE DRAWINGS

For a fuller understanding of the nature and objects of the invention, reference should be made to the following detailed description taken in connection with the accompanying drawings in which.

DETAILED DESCRIPTION

Figure 1A:
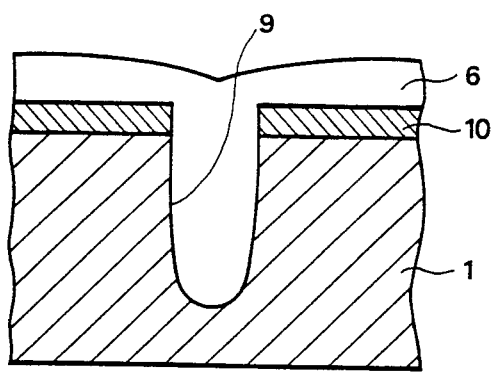
FIG. 1A is a cross-sectional view of a deposited doped oxide layer, after the formation of a trench over a masked wafer according to the prior art.

FIG. 1A shows masking layer 10 formed on the Si wafer 1 with trench 9 formed in Si wafer 1 by RIE (Reactive Ion Etching) or a similar process, and with a doped oxide layer 6, such as BSG or PSG, deposited as thick as, for example, 16000Å on the masking layer 10 and filling the trench 9.

In order to store the charge, the doped oxide layer 6 is etched to the proper region, "L", in order to form a P+ region (not shown in drawing) in the lower part of the trench 9. The masking layer 10, exposed by the etching process is removed by lithograpy as illustrated at FIG. 1B.

Figure 1B:
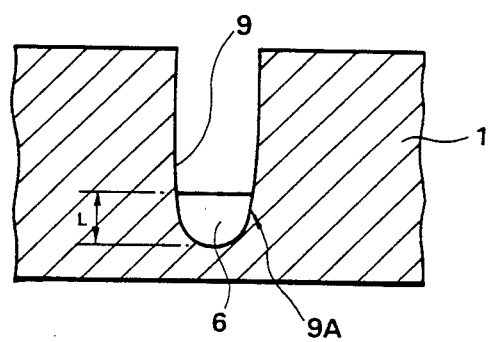
FIG. 1B is a cross-sectional view with the mask removed and the doped oxide layer removed to a certain depth inside the trench of FIG. 1A.

FIG. 1B further shows doped oxide 6 selectively removed to depth, "L", after the process of FIG. 1A. In selectively doping a side wall 9A of the trench 9 which determines the effective capacitance value, it is necessary to selectively remove the excess doped oxide 6, which is required when doping the side wall 9A of the trench 9; since the highly doped region (not shown in drawing) of the trench 9 inside is formed by continuously diffusing by successive thermal process, thereby causing a reach-through break down phenomenon occuring between the tranfer gate-drain region to be formed later and doping region (not shown in drawing).

Therefore, in the prior art as mentioned above, doped oxide, is deposited to fill-up the trench 9. Side wall doping is then performed after etching, and then any remaining doped oxide in the trench is removed by wet etching.

However, damage to the Si wafer surface and to the Si in the trench occurs because of increased etching time in the prior art wet etching process for removing the doped oxide from inside the trench 9.

Therefore, to protect the Si wafer from direct damage, the present invention provides a method for manufacturing a trench capacitor using a photoresist etch back process, as described below.

Figure 2A:
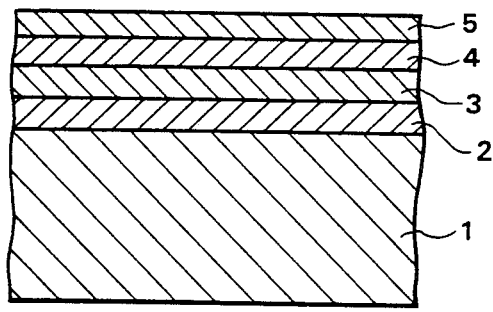
FIG. 2A is a cross-sectional view of the photoresist coated state after forming the masking layer over the wafer according to the present invention.
Figure 2B:
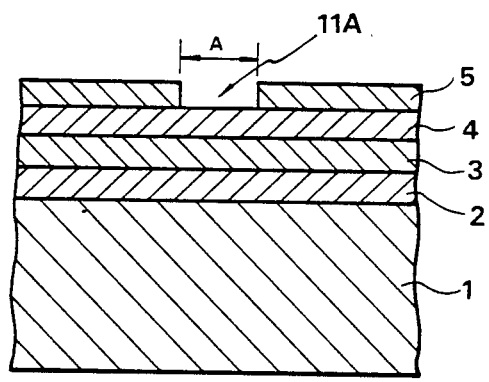
FIG. 2B is a cross-sectional view of FIG. 2A showing the first mask pattern formed by removing part, 'A', of the photoresist layer.

FIGS. 2A-4B illustrate the process of the present invention. Referring to FIG. 2A, an oxide layer 2 which acts as a mask layer, is deposited on the Si wafer 1. A nitride layer 3, which serves as an etch stoping layer detecting the etch end point, is then deposited on the oxide layer 2 to protect the Si wafer 1 from possible damage during the RIE (Reactive Ion Etching) process which is used to form the trench structure. Another oxide layer 4 is then deposited entirely over the nitride layer 3. Photoresist 5 is then coated on the oxide layer 4 to form a proper mask pattern. FIG. 2B shows the next step of the proper first mask pattern 11A formed by removing part 'A' of photoresist layer 5 using lithography.

Figure 2C:
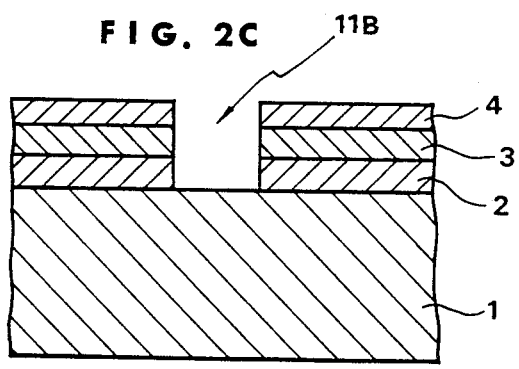
FIG. 2C is a cross-sectional view of FIG. 2B with the remaining photoresist completely removed after forming the second mask pattern by etching the masking layer along the first mask pattern.

FIG. 2C illustrates the etch masking layer, such as, 2 and the etch stopping layer, such as, 3 exposed by lithography removed by RIE to expose the Si wafer 1 surface, forming a second mask pattern 11B, and then any remaining photoresist 5 is stripped away.

Figure 3A:
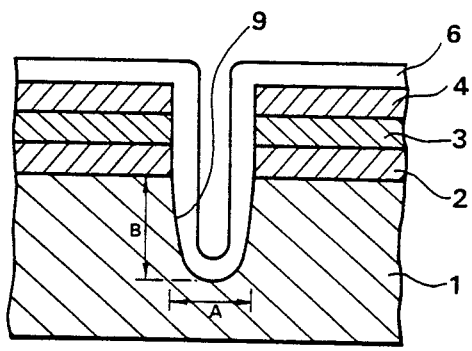
FIG. 3A is a cross-sectional view which shows a trench formed in the exposed Si wafer by the process of FIG. 2C, and deposition of a layer of doped oxide inside of the trench and over the oxide layer.

FIG. 3A shows Si wafer 1 exposed by the second mask pattern 11B process etched to depth 'B' and width 'A' by the RIE process, thereby forming a trench 9 in the Si wafer 1. Doped oxide 6 is deposited to the proper thickness thereon according to the methods for depositing constant thickness layers well known in the art.

In prior art process, doped oxide completely fills in the trench, as thick as 16,000 Å, as shown in FIG. 1A. In present process to the contrary, doped oxide thickness of, for example, 2000Å deposited in the form of thin film over the entire surface as illustrated at FIG. 3A. This avoids the need to fill trench 9 as shown at FIG. 1A. Selective etching of the intended part is more simple because doped oxide 6 is in the form of a thin film having a constant thickness.

Figure 3B:
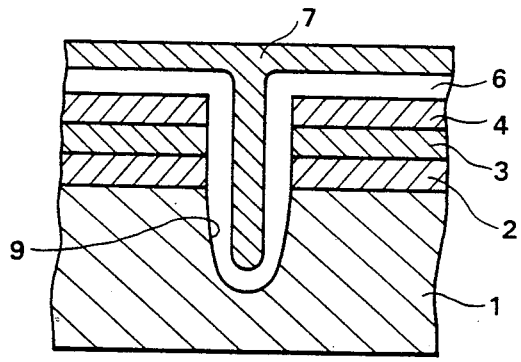
FIG. 3B is a cross-sectional view of the photoresist coated state over the deposited layer of doped oxide.
Figure 3C:
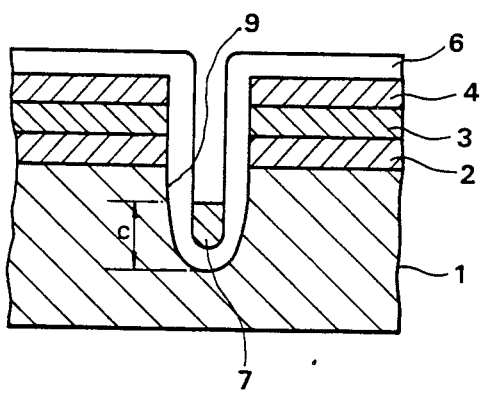
FIG. 3C is a cross-sectional view of FIG. 3A after removing the photo resist to the desired depth inside the trench.

FIG. 3B shows photoresist 7 coated on the doped oxide 6 in which the top of the photoresist is planarized. FIG. 3C shows the step in which the photoresist 7 has been removed leaving only a portion remaining in part "C", the intended region of trench 9. Here, any of the three embodiments of fabrication methods according to the present invention may be used to etch back the photoresist 7.

First: Wet station-method

This is a method to etch the photoresist 7 to depth "C" by dipping the Si wafer into a specific mixture of water and developer. That is, photoresist, such as KTI 820 photoresist, is coated and planarized by the dynamic double coating method on the Si wafer having the trench depth of, for example 5 μm, and is baked at the proper temperature and time. The wafer is then dipped into a wet sink containing the specific mixture of water and developer, such as KTI 934 developer, and the photoresist is etched according to the target. In this case, photoresist etch rate is controlled by varing the condition of soft and hard baking and the mixing rate of water and developer.

Also, since the etch rate of the photoresist on surface of Si wafer is different from that of inside the trench, the photoresist etch back method using the wet sink time etching should be performed which requires calculation of the etch rate by using NANOSPEC method of measuring optically the deposited thickness and refractive index, or by using SEM method of showing the wafer picture which is obtained by injecting an electron beam to a fluorescent screen and monitoring the back scattered second electron. Data is given below as an example of the photoresist etch rate according to mixing rate of water and developer.

| Example (by volume) | |
| --- | --- |
| Developer:water (KTI 934 developer) | etch rate of photoresist (KTI 820 photoresist) |
| 1:1 | 680 Å/min |
| 5:3 | 140 Å/min |

In summary to etch photoresist with a mixture of water and developer first, the photoresist etch rate must be determined by sample etching and then time etching is performed in accordance with desired etching data. This provides increased productivity and controlable etching speed by varing the mixing rate of water and developer. That is, by increasing the amount of water, etching time is increased, and increasing the amount of developer, etching time is decreased. In this method, it is important to calculate the etching time by determining the etching speed over the wafer surface and inside the trench respectively.

Second: Track-method

This is a method to etch only desired photoresist by using a developer on the track. This method provides a good uniformity Although productivity is lower than that of the wet station method, this method has many advantages such as a lower particle effect, a simplified process with good reproducable results.

Explaining in greater detail, the Si wafer with a 5 μm deep trench, for example, is filled-up with photoresist of KTI 820(27 CSTK) and planarized by the dynamic two step coating method, and is then baked for the proper time and temperature. The photoresist etch back process is then performed by the puddle method with a developer, such as NMD-2 or NMD-3, which is used on the track. In this case, the photoresist etch rate must be calculated and the time for etching is performed to satisfy the process target. Here, the etch rate is 670Å/Sec in single bake and 1900Å/Sec in double bake. As can be seen, the etch rate of the double bake is greater than that of single bake. In order to increase the uniformity in the process of photoresist etch back, the exhaust damper pressure is set to '0' and the puddle method is used. Persistance of wafers and uniformity among the wafers were very good. The process conditions of present invention as an example, are as follows:

1. Prime process:
   Convection oven, HMDS, 150Sec/72° C.
2. Photoresist coating process:
   KTI 820(27 cs), two step dispense/dynamic method, 1500 rpm, exhaust pressure 10 mmHg20
3. Baking process:
   first bake; 75° C./60 Sec
   second(post) bake; 120° C./3 Sec
4. etch back process:
   NHD-3(developer 2.38%), puddle method, exhaust pressure mmHg20

In this process condition, the first bake takes about 100 Sec and the post bake about 50 Sec. On the other hand, to increase the process latitude, it is profitable to decrease the etching speed, and to do it etching time is about 420 Sec only in the cases of 100° C./6 Sec of first bake, 80° C./50 Sec of post bake, and KTI 934 (developer 50%) as an etchant. Therefore, according to the track method, etching speed is controlled by varying the kinds of developer and baking temperature.

Third: Oxygen plasma-gas method

This is a photoresist etch back method to use dry etcher after forming the depth, for example, 5 μm of trench and planarizing the photoresist filled in the trench by the dynamic double coating method. According to the method, gases such as Oxygen or a mixture of gases, such as fluorides and Oxygen ($CHF_3+O_2$ or $CF_4O_2$) may be used. The photoresist etch rate depends on the amount of Oxygen gas, voltage and pressure used. In this case, it is noted that if the etching condition is not proper, photoresist etching uniformity or photoresist development is difficult. When photoresist was etched with high power and low pressure, control of photoresist etching uniformity was easy to achieve and also the etched surface was clean. In the photoresist etch back process, since etch rate of the photoresist on surface of Si wafer is different from that of the trench inside, photo resist etch rate is obtained with SEM and etching endpoint on the Si wafer is detected with end point detection system, and then next etching is performed according to these data. To implement the present invention, the calculated etch rate is given below as an example:

| | |
| --- | --- |
| Etch rate: | 950 Å/min ($O_2$ plasma: 80 Vdc, 500 m torr) |
| | 350 Å/min ($CHF_3 + O_2$ plasma: 50/10 sccm, 300 Vdc, 40 m torr) |
| | 580 Å/min ($CF_4 + O_2$ plasma: 50/10 sccm, 350 Vdc, 30 m torr) |

Figure 4A:
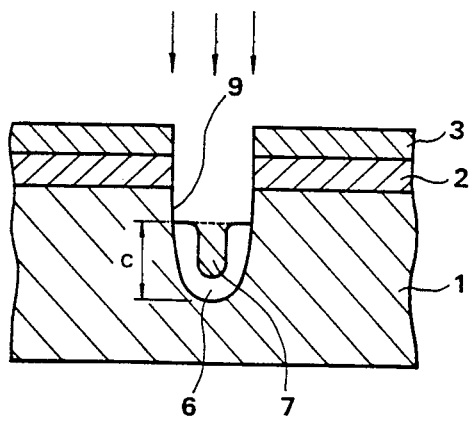
FIG. 4A is a cross-sectional view of FIG. 3B which shows a thermal processed state, before which the doped oxide is removed to the extent of the remaining photoresist by using the photoresist etch back process according to the present invention.
Figure 4B:
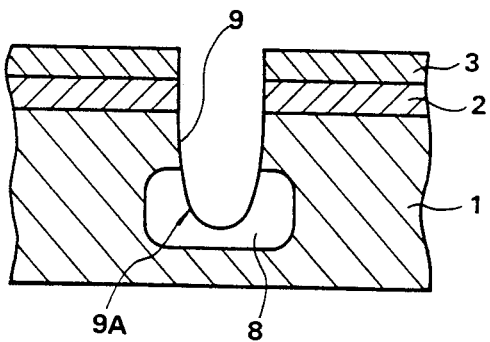
FIG. 4B is a cross-sectional view of FIG. 4A which shows the selectively doped source region inside the trench by using a thermal process.

According to the method for manufacturing a trench capacitor using a photoresist etch back process as mentioned above, the excess photoresist 7 can be easily and selectively removed from the interior of the trench 9, as illustrated at FIG. 3C. In the next step, doped oxide 6 is etched by the RIE process to the same extend to which photoresist 7 remains in trench 9. During this step the oxide layer 4 is also completely removed. FIG. 4A shows the remaining photoresist 7 having been removed by using the wet station-method, oxygen plasma gas-method, or track-method, according to the present invention. The deposited doped oxide material 6 is then diffused into the Si wafer 1 by a high temperature process thereby selectively forming a doping region 8, such as a P+ diffusion region. Then the remaining deposited doped oxide material 6 is removed in the same manner as known in the art, as shown at FIG. 4B. Therefore, the present invention can provide a trench capacitor of the semiconductor device which is made by selective doping of the desired part only.

As mentioned above, according to the present invention, the unnecessary portion of doped oxide can be selectively etched away so that selective doping is possible and etching time is decreased. According to the invention it is possible to protect from damage the Si wafer surface and the Si interior of the trench during etching and to remarkably increase product uniformity.

What is claimed is:

1. A method for manufacturing a trench capacitor using a photoresist etch back process comprising:
   providing a silicon wafer;
   sequentially depositing an oxide layer, a nitride layer and an oxide layer as a mask layer on the Si wafer and coating the mask layer with a photoresist layer, and
   forming a first mask pattern by removing a portion of the photoresist layer;
   forming a second mask pattern by removing the exposed mask layer along the photoresist pattern, and removing the photoresist completely;

forming a trench in the Si wafer along the second mask pattern;

depositing a thin doped oxide layer having a constant thickness outside and inside the trench, entirely coating the doped oxide layer with a photoresist, thereby filling the trench with photoresist, then planarizing the top surface of the photoresist;

baking the resulting photoresist coated Si wafer, and selectively etching back the photoresist deposited outside and inside the trench;

selectively etching the doped oxide layer to the photoresist remaining in the trench, together with the oxide layer; and completely removing the photoresist remaining inside the trench, and thermal processing the doped oxide inside the trench, thereby forming a selective doping region along the wall of the trench in the Si wafer.

2. The method for manufacturing a trench capacitor using a photoresist etch back process of claim 1 wherein the photoresist etch back process is a wet station-method which comprises dipping the Si wafer having the trench, on which photoresist is coated by dynamic double coating process, planarized and baked thereof, in the wet sink containing the mixture of water and developer, and selectively etching back the photoresist according to a target.

3. The method for manufacturing a trench capacitor using a photoresist etch back process of claim 2 wherein the photoresist etch back process by wet station-method further comprises determining etching time by calculating the desired etching thickness of photoresist, after first determining the photoresist etch rate outside the trench by sample etching thereof.

4. The method for manufacturing a trench capacitor using a photoresist etch back process of claim 1 wherein the photoresist etch back process includes a track method which comprises developing a Si wafer having the trench, on which a photoresist is coated by a dynamic double coating process, planarized and baked, with the developer on the track, and selectively etching back the photoresist according to a target.

5. The method for manufacturing trench capacitor using photoresist etch back process of claim 2 wherein the photoresist etch back process by the track-method comprises determining etching time by controlling etching speed according to the developer and baking temperature.

6. The method for manufacturing a trench capacitor using a photoresist etch back process of claim 1, wherein the photoresist etch back process includes as Oxygen plasma-gas method which comprises exposing the Si wafer, on which photoresist is coated by dynamic double coating process planarized and baked, to an Oxygen plasma gas with a dry etcher, and selectively etching back the photoresist by controlling the amount of the gas, voltage or pressure of the dry etcher.

7. The method for manufacturing a trench capacitor using a photoresist etch back process of claim 6 wherein the photoresist etch back process by Oxygen plasma-gas method comprises determining photoresist etch rate inside the trench by using SEM, detecting etch end point of Si wafer surface by using end point detector system.

* * * * *

UNITED STATES PATENT AND TRADEMARK OFFICE
CERTIFICATE OF CORRECTION

PATENT NO. : 4,994,409
DATED : February 19, 1991
INVENTOR(S) : Yong H. Yoon and Cheol K. Bok It is certified that error appears in the above-identified patent and that said Letters Patent is hereby corrected as shown below:

In Column 6, Line 5 of the printed patent,

"$CF_4O_2$" should be --- $CF_4 + O_2$ ---

Signed and Sealed this

Fourteenth Day of July, 1992

Attest:

DOUGLAS B. COMER

*Attesting Officer*  *Acting Commissioner of Patents and Trademarks*